United States Patent
Kwon et al.

(10) Patent No.: US 10,392,459 B2
(45) Date of Patent: Aug. 27, 2019

(54) PHOTOCURABLE COMPOSITION AND DEVICE INCLUDING BARRIER LAYER FORMED FROM COMPOSITION

(71) Applicant: CHEIL INDUSTRIES, INC., Gumi-si, Gyeongsangbuk-do (KR)

(72) Inventors: Ji Hye Kwon, Uiwang-si (KR); Hyo Young Kwon, Uiwang-si (KR); Seong Ryong Nam, Uiwang-si (KR); Se Il Oh, Uiwang-si (KR); Chang Soo Woo, Uiwang-si (KR); Yeon Soo Lee, Uiwang-si (KR); Chang Min Lee, Uiwang-si (KR); Seung Jib Choi, Uiwang-si (KR); Kyoung Jin Ha, Uiwang-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 465 days.

(21) Appl. No.: 14/649,478

(22) PCT Filed: Jul. 8, 2013

(86) PCT No.: PCT/KR2013/006056
§ 371 (c)(1),
(2) Date: Jun. 3, 2015

(87) PCT Pub. No.: WO2014/092270
PCT Pub. Date: Jun. 19, 2014

(65) Prior Publication Data
US 2015/0318482 A1    Nov. 5, 2015

(30) Foreign Application Priority Data
Dec. 12, 2012 (KR) .................. 10-2012-0144908

(51) Int. Cl.
*C08F 230/02* (2006.01)
*H01L 51/00* (2006.01)
(Continued)

(52) U.S. Cl.
CPC ............ *C08F 230/02* (2013.01); *G03F 7/027* (2013.01); *H01L 51/0043* (2013.01);
(Continued)

(58) Field of Classification Search
CPC ...... C08F 230/02; C08F 130/02; C08F 30/02; C08L 43/02
See application file for complete search history.

(56) References Cited

U.S. PATENT DOCUMENTS 3,365,530 A * 1/1968 Bahr ................. C07F 9/4006
525/36
4,264,643 A * 4/1981 Granata ............ D06N 7/0005
156/244.23
(Continued)

FOREIGN PATENT DOCUMENTS

CN     1643096 A    7/2005
CN   101374896 A    2/2009
(Continued)

OTHER PUBLICATIONS

Provisional double patenting rejection over claims of the above-identified application; USPTO Office action dated Feb. 14, 2019, in U.S. Appl. No. 15/690,855.
(Continued)

*Primary Examiner* — Ling Siu Choi
*Assistant Examiner* — David L Miller
(74) *Attorney, Agent, or Firm* — Lee & Morse, P.C.

(57) ABSTRACT

The present invention relates to: a photocurable composition containing (A) a photocurable monomer and (B) a monomer containing phosphorus and an amide group; and a device including a barrier layer formed of the composition.

6 Claims, 1 Drawing Sheet

(51) Int. Cl.
   *H01L 51/52*   (2006.01)
   *G03F 7/027*   (2006.01)
   *C08F 30/02*   (2006.01)
   *C08L 43/02*   (2006.01)
   *C08F 130/02*   (2006.01)

(52) U.S. Cl.
   CPC .......... *H01L 51/5253* (2013.01); *C08F 30/02* (2013.01); *C08F 130/02* (2013.01); *C08L 43/02* (2013.01)

(56) References Cited

U.S. PATENT DOCUMENTS

| | | | | |
|---|---|---|---|---|
| 5,804,680 | A * | 9/1998 | Plundrich | C08F 30/02 106/287.29 |
| 6,440,519 | B1 * | 8/2002 | Takase | C08G 18/672 156/275.5 |
| 9,587,046 | B2 * | 3/2017 | Lee | C08F 36/20 |
| 2005/0107556 | A1 * | 5/2005 | Tamura | C08G 18/0823 526/319 |

FOREIGN PATENT DOCUMENTS

| | | |
|---|---|---|
| CN | 102532426 A | 7/2012 |
| CN | 102533206 A | 7/2012 |
| JP | 2000198824 A | 7/2000 |
| JP | 2010-160906 A | 7/2010 |
| KR | 100627082 B1 | 9/2006 |
| KR | 10-2010-0022910 A | 3/2010 |
| KR | 10-2012-0077914 A | 7/2012 |
| KR | 10-2012-0078464 A | 7/2012 |
| WO | WO 00-22022 A1 | 4/2000 |

OTHER PUBLICATIONS

Chinese Office Action dated Jul. 4, 2018 in the corresponding Chinese Patent Application No. 2013800649631.

* cited by examiner

PHOTOCURABLE COMPOSITION AND DEVICE INCLUDING BARRIER LAYER FORMED FROM COMPOSITION

TECHNICAL FIELD

The present invention relates to a photocurable composition and an apparatus including a barrier layer formed of the composition. More particularly, the present invention relates to a photocurable composition which can realize an organic barrier layer having low water vapor permeability and low outgassing after curing, and has high photocuring rate and thus low curing shrinkage stress and exhibits high adhesion to an inorganic barrier layer and thus can minimize damage to a member an apparatus, thereby preventing performance deterioration while extending lifespan of the member, and an apparatus including a barrier layer formed of the composition.

BACKGROUND ART

An organic light emitting diode (OLED) has a structure in which a functional organic layer is interposed between a cathode and an anode, and produces highly energetic excitons by recombination of holes injected from the anode with electrons injected from the cathode. The produced excitons are transferred to a ground state to generate light with a specific wavelength. Organic light emitting diodes have advantages of self-luminescence, fast response, wide viewing angle, ultra-slimness, high-definition, and durability.

However, organic light emitting diodes have a problem of deterioration in performance and lifespan due to oxidation of organic materials and/or electrode materials caused by moisture or oxygen from outside or internally or externally generated outgases. To overcome this problem, there have been proposed methods of applying photocurable sealing agents to a substrate with organic light emitting diodes, attaching transparent or opaque desiccants thereto, or forming fits thereon.

By way of example, Korean Patent Laid-open Publication No. 2006-0084978 discloses an organic light emitting diode encapsulation structure which uses a protective film for sealing formed of one of silicon compounds and polymer resins, as a waterproofing material.

DISCLOSURE

Technical Problem

It is an aspect of the present invention to provide a photocurable composition capable of realizing an organic barrier layer which has extremely low water vapor permeability and outgassing after curing.

It is another aspect of the present invention to provide a photocurable composition capable of realizing a layer which has high photocuring rate and can avoid a shift due to shrinkage stress after curing.

It is a further aspect of the present invention to provide a photocurable composition capable of realizing a layer exhibiting high adhesion to an inorganic barrier layer or a substrate.

It is yet another aspect of the present invention to provide a photocurable composition capable of realizing a layer which can extend lifespan of a member for an apparatus and prevent performance deterioration of the member when used in encapsulating the member.

It is yet another aspect of the present invention to provide an apparatus including a layer formed of the photocurable composition as set forth above.

Technical Solution

In accordance with one aspect of the present invention, a photocurable composition may include: (A) a photocurable monomer; and (B) a photocurable monomer containing phosphorus and an amide group.

In accordance with another aspect of the present invention, an organic electroluminescent display includes: an organic light emitting diode; an inorganic barrier layer encapsulating the organic light emitting diode; and an organic barrier layer stacked on the inorganic barrier layer, wherein the organic barrier layer may have an outgassing amount of 1000 ppm or less.

In accordance with a further aspect of the present invention, an organic electroluminescent display includes: an organic light emitting diode; an inorganic barrier layer encapsulating the organic light emitting diode; and an organic barrier layer stacked on the inorganic barrier layer, wherein the organic barrier layer may have a water vapor permeability of 4.5 $g/m^2 \cdot 24$ hr or less as measured on a coating thickness of 5 μm in a thickness direction of the organic barrier layer at 37.8° C. and 100% RH for 24 hours.

In accordance with yet another aspect of the present invention, an organic electroluminescent display includes: an organic light emitting diode; an inorganic barrier layer encapsulating the organic light emitting diode; and an organic barrier layer stacked on the inorganic barrier layer, wherein the organic barrier layer may have an adhesion strength to the inorganic barrier layer of 11 $kgf/(mm)^2$ to 100 $kgf/(mm)^2$.

Advantageous Effects

The present invention provides a photocurable composition capable of realizing a layer which has extremely low water vapor permeability and outgassing after curing and thus can prevent performance deterioration of a member for an apparatus and extend lifespan of the member when used in encapsulating the member. In addition, the present invention provides a photocurable composition capable of realizing a layer which has a high photocuring rate and thus can avoid a shift when encapsulating a member for an apparatus, and exhibits high adhesion to an inorganic barrier layer or a substrate.

BEST MODE

Figure 1:
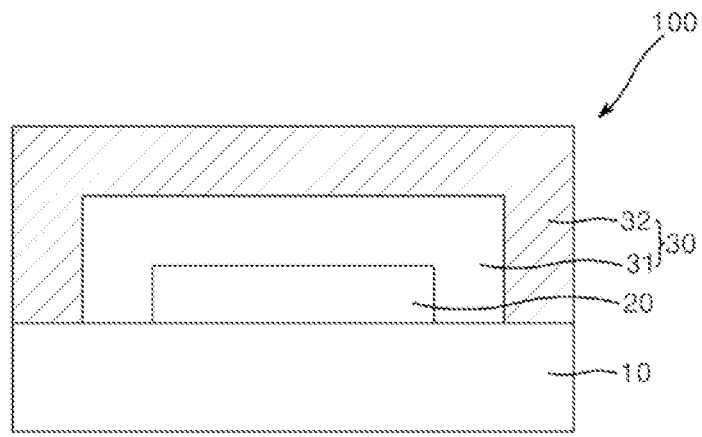
FIG. 1 is a schematic sectional view of an apparatus according to one embodiment of the present invention.

As used herein, unless otherwise stated, the term "substituted" means that at least one hydrogen atom among functional groups of the present invention is substituted with a halogen atom (F, Cl, Br or I), a hydroxyl group, a nitro group, a cyano group, an imino group (=NH, =NR (R: a $C_1$ to $C_{10}$ alkyl group)), an amino group (—$NH_2$, —NH(R'), —N(R")(R'"), where R', R" and R'" are each independently a $C_1$ to $C_{10}$ alkyl group), an amidino group, a hydrazine or hydrazone group, a carboxyl group, a substituted or unsubstituted $C_1$ to $C_{20}$ alkyl group, a substituted or unsubstituted $C_6$ to $C_{30}$ aryl group, a substituted or unsubstituted $C_3$ to $C_{30}$ cycloalkyl group, a substituted or unsubstituted $C_3$ to $C_{30}$ heteroaryl group, or a substituted or unsubstituted $C_2$ to $C_{30}$ heterocycloalkyl group.

As used herein, the term "hetero" means that a carbon atom is substituted with an atom selected from the group consisting of N, O, S, and P.

As used herein, "*" refers to a binding site in a molecule.

In accordance with one aspect of the present invention, a photocurable composition may include (A) a photocurable monomer, (B) a monomer containing phosphorus and an amide group.

(A) Photocurable Monomer

The photocurable monomer may be a non-phosphorus or non-amide monomer which does not include at least one of phosphorus and an amide group.

The photocurable monomer has a photocurable functional group (for example, a (meth)acrylate group, a vinyl group, etc.) and thus can undergo curing reaction in the presence of an initiator or the like.

In one embodiment, the photocurable monomer may include a monofunctional monomer, a polyfunctional monomer, or a combination thereof. The photocurable monomer may include a monomer containing 1 to 30, preferably 1 to 20, more preferably 1 to 5 substituted or unsubstituted vinyl groups, acrylate groups, or methacrylate groups.

The photocurable monomer may include a mixture of a monofunctional monomer and a polyfunctional monomer. In the mixture, the monofunctional monomer and the polyfunctional monomer may be present in a weight ratio of 1:0.1 to 1:10, preferably 1:2 to about 1:8.

The photocurable monomer may include: $C_6$ to $C_{20}$ aromatic compounds containing a substituted or unsubstituted vinyl group; unsaturated carboxylic acid esters containing a $C_1$ to $C_{20}$ alkyl group, a $C_3$ to $C_{20}$ cycloalkyl group, a $C_6$ to $C_{20}$ aromatic group, or a hydroxyl group and a $C_1$ to $C_{20}$ alkyl group; $C_1$ to $C_{20}$ aminoalkyl group-containing unsaturated carboxylic acid esters; vinyl esters of $C_1$ to $C_{20}$ saturated or unsaturated carboxylic acids; vinyl cyanide compounds; and unsaturated amide compounds.

In some embodiments, the photocurable monomer may include: $C_6$ to $C_{20}$ aromatic compounds containing an alkenyl group including a vinyl group, such as styrene, α-methyl styrene, vinyl toluene, vinyl benzyl ether, and vinyl benzyl methyl ether; unsaturated carboxylic acid esters, such as methyl (meth)acrylate, ethyl (meth)acrylate, butyl (meth)acrylate, 2-hydroxyethyl (meth)acrylate, 2-hydroxybutyl (meth)acrylate, hexyl (meth)acrylate, octyl (meth)acrylate, nonyl (meth)acrylate, decanyl (meth)acrylate, undecanyl (meth)acrylate, dodecyl (meth)acrylate, cyclohexyl (meth)acrylate, benzyl (meth)acrylate, phenyl (meth)acrylate, and the like; unsaturated carboxylic acid aminoalkyl esters, such as 2-aminoethyl (meth)acrylate, 2-dimethylaminoethyl (meth)acrylate, and the like; saturated or unsaturated carboxylic acid vinyl esters, such as vinyl acetate, vinyl benzoate, and the like; unsaturated $C_1$ to $C_{20}$ carboxylic acid glycidyl esters, such as glycidyl (meth)acrylate; vinyl cyanide compounds, such as (meth)acrylonitrile; unsaturated amide compounds, such as (meth)acrylamide; and monofunctional or polyfunctional (meth)acrylates of monohydric or polyhydric alcohols including ethylene glycol di(meth)acrylate, triethylene glycol di(meth)acrylate, trimethylolpropane tri(meth)acrylate, 1,4-butanediol di(meth)acrylate, 1,6-hexanediol di(meth)acrylate, octyldiol di(meth)acrylate, nonyldiol di(meth)acrylate, decanyldiol di(meth)acrylate, undecanyldiol di(meth)acrylate, dodecyldiol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, di pentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, novolac epoxy (meth)acrylate, diethylene glycol di(meth)acrylate, tri(propylene glycol) di(meth)acrylate, poly(propylene glycol) di(meth)acrylate, and the like, without being limited thereto. The term "polyhydric alcohol" refers to alcohols containing two or more, for example, 2 to 20, preferably 2 to 10, more preferably 2 to 6 hydroxyl groups.

Preferably, the photocurable monomer includes at least one of $C_1$ to $C_{20}$ alkyl group-containing (meth)acrylates, $C_2$ to $C_{20}$ diol di(meth)acrylates, $C_3$ to $C_{20}$ triol tri(meth)acrylates, and $C_4$ to $C_{20}$ tetraol tetra(meth)acrylates.

The photocurable monomer may be present, in terms of solid content, in an amount of 1 part by weight to 99 parts by weight, preferably 20 parts by weight to 95 parts by weight, more preferably 30 parts by weight to 95 parts by weight, even more preferably 60 parts by weight to 95 parts by weight, most preferably 70 part by weight to 90 parts by weight based on 100 parts by weight of (A)+(B). Within this range, the composition can exhibit high resistance to plasma and thus can reduce outgassing which can result from plasma upon manufacture of a thin film encapsulation layer, while reducing water vapor permeability.

(B) Monomer Containing Phosphorus and Amide Group

The monomer may be a photocurable monomer which includes both phosphorus and an amide group, and contains a photocurable functional group (for example, a (meth)acrylate group, a vinyl group, etc.).

In some embodiments, the monomer may be represented by Formula 1:

[Formula 1]

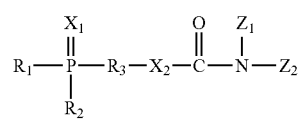

wherein $X_1$ and $X_2$ are the same or different and are each independently O, S, NH, or NR' (R': hydrogen or a substituted or unsubstituted $C_1$ to $C_{20}$ alkyl group);

$R_1$ and $R_2$ are the same or different and are each independently hydrogen, a substituted or unsubstituted $C_1$ to $C_{30}$ alkyl group, a substituted or unsubstituted $C_3$ to $C_{30}$ cycloalkyl group, a substituted or unsubstituted $C_1$ to $C_{30}$ alkyl ether group, a substituted or unsubstituted $C_1$ to $C_{30}$ alkylamine group, a substituted or unsubstituted $C_1$ to $C_{30}$ dialkylamine group, a substituted or unsubstituted $C_1$ to $C_{30}$ thioalkyl group, a substituted or unsubstituted $C_6$ to $C_{30}$ aryl group, a substituted or unsubstituted $C_7$ to $C_{30}$ arylalkyl group, a substituted or unsubstituted $C_1$ to $C_{30}$ alkoxy group, or a substituted or unsubstituted $C_7$ to $C_{30}$ arylalkoxy group;

$R_3$ is a substituted or unsubstituted $C_1$ to $C_{30}$ alkylene group, a substituted or unsubstituted $C_5$ to $C_{30}$ cycloalkylene group, a substituted or unsubstituted $C_1$ to $C_{30}$ alkyl ether group, a substituted or unsubstituted $C_1$ to $C_{30}$ alkylamine group, a substituted or unsubstituted $C_6$ to $C_{30}$ arylene group, a substituted or unsubstituted $C_7$ to $C_{30}$ arylalkylene group, or a substituted or unsubstituted $C_1$ to $C_{30}$ alkyleneoxy group;

$Z_1$ and $Z_2$ are the same or different and are each independently a hydrogen atom or a $C_1$ to $C_{10}$ alkyl group, or represented by Formula 2:

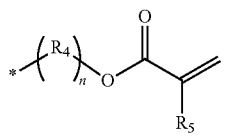

[Formula 2]

(wherein * represents a binding site to N in Formula 1; $R_4$ is a substituted or unsubstituted $C_1$ to $C_{30}$ alkylene group, a substituted or unsubstituted $C_6$ to $C_{30}$ arylene group, a substituted or unsubstituted $C_7$ to $C_{30}$ arylalkylene group, or a substituted or unsubstituted $C_1$ to $C_{30}$ alkyleneoxy group; $R_5$ is hydrogen or a substituted or unsubstituted $C_1$ to $C_5$ alkyl group; and n is an integer from 0 to 20); and at least one of $Z_1$ and $Z_2$ is represented by Formula 2.

$R_1$ and $R_2$ may each independently be a $C_1$ to $C_{10}$ alkoxy group or a $C_6$ to $C_{30}$ aryl group.

$R_3$ may be a $C_1$ to $C_{10}$ alkylene group.

$R_4$ may be a $C_1$ to $C_{30}$ alkylene group.

Preferably, n is an integer from 1 to 20, more preferably from 1 to 10.

The monomer may be prepared by any typical methods, or may be commercially available products.

The monomer is cured together with the photocurable monomer and can realize a layer having extremely low water vapor permeability and outgassing after curing, and can increase photocuring rate. Further, the monomer exhibits high adhesion to a substrate or an inorganic barrier layer. Thus, in a typical encapsulation structure in which an organic barrier layer is stacked on an inorganic barrier layer, when the monomer is included in the organic barrier layer, the organic barrier layer can exhibit enhanced adhesion to the inorganic barrier layer.

The monomer may be present, in terms of solid content, in an amount of 1 part by weight to 99 parts by weight based on 100 parts by weight of (A)+(B). The monomer is preferably present in an amount of 5 parts by weight to 80 parts by weight, more preferably 5 parts by weight to 70 parts by weight, even more preferably 5 parts by weight to 40 parts by weight, most preferably 10 parts by weight to 30 parts by weight. Within this range, the monomer can provide enhanced adhesion to an inorganic barrier layer and reduced water vapor permeability.

The composition may further include an initiator.

(C) Initiator

The initiator is not restricted to a particular initiator so long as the initiator can perform curing reaction. In some embodiments, the initiator may include a photopolymerization initiator.

The photopolymerization initiator includes any typical photopolymerization initiators capable of performing photocuring reaction without limitation. For example, the photopolymerization initiator may include triazine initiators, acetophenone initiators, benzophenone initiators, thioxanthone initiators, benzoin initiators, phosphorus initiators, oxime initiators, and mixtures thereof.

Examples of the triazine initiators may include 2,4,6-trichloro-s-triazine, 2-phenyl-4,6-bis(trichloromethyl)-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloromethyl(piperonyl)-6-triazine, 2,4-(trichloromethyl(4'-methoxystyryl)-6-triazine, and mixtures thereof.

Examples of the acetophenone initiators may include 2,2'-diethoxyacetophenone, 2,2'-dibuthoxyacetophenone, 2-hydroxy-2-methyl propiophenone, p-t-butyl trichloroacetophenone, p-t-butyl dichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and mixtures thereof.

Examples of the benzophenone initiators may include benzophenone, benzoyl benzoate, methyl benzoylbenzoate, 4-phenyl benzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and mixtures thereof.

Examples of the thioxanthone initiators may include thioxanthone, 2-methyl thioxanthone, isopropyl thioxanthone, 2,4-diethylthioxanthone, 2,4-diisopropylthioxanthone, 2-chlorothioxanthone, and mixtures thereof.

Examples of the benzoin initiators may include benzoin, benzoin methyl ether, benzoin ethyl ether, benzoin isopropyl ether, benzoin isobutyl ether, benzyl dimethyl ketal, and mixtures thereof.

Examples of the phosphorus initiators may include bis-benzoylphenyl phosphine oxide, benzoyl(diphenyl) phosphine oxide, and mixtures thereof.

Examples of the oxime initiators may include 2-(o-benzoyloxime)-1-[4-(phenylthio)phenyl]-1,2-octanedione, 1-(o-acetyloxime)-1-[9-ethyl-6-(2-methylbenzoyl)-9H-carbazole-3-yl]ethanone, and mixtures thereof.

The initiator may be present, in terms of solid content, in an amount of 0.1 parts by weight to 20 parts by weight based on 100 parts by weight of (A)+(B). With in this range, the photocurable composition allows sufficient photopolymerization and can prevent deterioration in transmittance due to the unreacted initiator remaining after photopolymerization. The initiator is preferably present in an amount of 0.5 parts by weight to 10 parts by weight, more preferably 1 part by weight to 8 parts by weight.

The photocurable composition may have a photocuring rate of 90% or higher. Within this range, the composition can realize a layer which does not suffer from a shift by virtue of low shrinkage stress after curing and thus can be used for encapsulation of a member for an apparatus. The photocurable composition preferably has a photocuring rate of 90% to 99%, more preferably 93% to 97%.

The photocuring rate may be measured by any typical method. For example, the photocurable composition is applied to a glass substrate, followed by UV curing through UV irradiation at 100 mW/cm$^2$ for 10 seconds. Then, the cured film is aliquoted, followed by measuring photocuring rate using FT-IR. Photocuring rate is calculated in accordance with conditions as defined in experimental examples described below.

The photocurable composition can form an organic barrier layer encapsulating a member for an apparatus including organic light emitting diodes, organic solar cells, and the like.

In accordance with another aspect of the present invention, an encapsulated apparatus may include an organic barrier layer formed of the composition.

The apparatus may include a member for the apparatus; and a barrier stack formed on the member for the apparatus and including an inorganic barrier layer and an organic barrier layer.

The organic barrier layer may refer to an encapsulation layer protecting a member for an apparatus including organic light emitting diodes, organic solar cells, and the like. The organic barrier layer encapsulates the member for the apparatus to prevent the member from suffering from degradation or oxidation due to moisture, oxygen, and the like in a surrounding environment. In addition, the organic barrier layer exhibits considerably low outgassing even under high-humidity or high-temperature and high-humidity conditions, and thus minimizes effects of outgassing on the member for the apparatus, thereby preventing performance deterioration and reduction in lifespan of the member for the apparatus.

Examples of the member for the apparatus may include organic light emitting diodes, organic light emitting devices, flexible organic light emitting devices, illumination devices, metal sensor pads, microdisc lasers, electrochromic devices, photochromic devices, microelectromechanical systems, solar cells, integrated circuits, charge coupled devices, light emitting polymers, and light emitting diodes.

In some embodiments, the apparatus may include a substrate, a member for the apparatus formed on the substrate, an inorganic barrier layer encapsulating the member for the apparatus, and an organic barrier layer stacked on the inorganic barrier layer and formed of the composition.

Examples of the apparatus may include organic electroluminescent displays including organic light emitting diodes, solar cells, and liquid crystal displays, without being limited thereto.

The substrate is not particularly restricted so long as the member for the apparatus can be stacked on the substrate. For example, the substrate may be formed of a material, such as transparent glass, a plastic sheet, a flexible substrate such as silicon, or a metal substrate.

The member for the apparatus can suffer from degradation or oxidation when exposed to a surrounding environment such as moisture, oxygen, and the like, and examples of the member may include organic light emitting diodes, organic solar cells, and the like.

In the apparatus, the member for the apparatus is encapsulated by barrier layers having different properties, i.e. the inorganic barrier layer and the organic barrier layer. At least one of the inorganic barrier layer and the organic barrier layer may be coupled to the substrate to encapsulate the member for the apparatus.

The inorganic barrier layer may refer to an encapsulation layer protecting a member for an apparatus including organic light emitting diodes, organic solar cells, and the like. The inorganic barrier layer may be in contact with the member for the apparatus to encapsulate the member for the apparatus, or may encapsulate an internal space containing the member for the apparatus without being in contact with the member for the apparatus. The inorganic barrier layer can interrupt contact between external oxygen or moisture and the member for the apparatus, thereby preventing degradation or damage of the member for the apparatus.

The inorganic barrier layer may be formed of metals, intermetallic compounds or alloys, oxides of metals or mixed metals, fluorides of metals or mixed metals, nitrides of metals or mixed metals, oxynitrides of metals or mixed metals, borides of metals or mixed metals, oxyborides of metals or mixed metals, silicides of metals or mixed metals, or combinations thereof. The metals may include silicon, aluminum, transition metals, lanthanide metals, indium, germanium, tin, antimony, bismuth, selenium, or combinations thereof.

The inorganic barrier layer may be deposited by a vacuum process, for example, sputtering, chemical vapor deposition, metal organic chemical vapor deposition, plasma chemical vapor deposition, evaporation, sublimation, electron cyclotron resonance-plasma enhanced chemical vapor deposition, or combinations thereof.

The inorganic barrier layer may have a thickness of 100 Å to 2000 Å, without being limited thereto.

The organic barrier layer is stacked on the inorganic barrier layer and is composed of a different material than the inorganic barrier layer, and thus can supplement or reinforce interruption of contact between external oxygen or moisture and the member for the apparatus by the inorganic barrier layer.

The organic barrier layer exhibits considerably low outgassing, and thus can minimize effects of outgassing on the member for the apparatus, thereby preventing degradation or performance deterioration of the member for the apparatus due to outgassing. Specifically, the organic barrier layer may have an outgassing amount of 1000 ppm or less. Within this range, the organic barrier layer can have insignificant adverse effect on the member for the apparatus and extend lifespan of the member for the apparatus when used for the member for the apparatus. The organic barrier layer preferably has an outgassing amount of about 10 ppm to 1000 ppm, more preferably 150 ppm to 750 ppm.

Outgassing amount may be measured by a typical method. For example, the photocurable composition is coated onto a glass substrate, followed by UV curing through UV irradiation at 100 mW/cm$^2$ for 10 seconds, thereby obtaining an organic barrier layer specimen having a size of 20 cm×20 cm×3 μm (width×length×thickness). For the specimen, outgassing amount is measured in accordance with conditions defined in experimental examples.

The organic barrier layer may have an adhesive strength to the inorganic barrier layer of 11 kgf/(mm)$^2$ to 100 kgf/(mm)$^2$. If the adhesive strength is less than 11 kgf/(mm)$^2$, external moisture or oxygen can easily permeate between the inorganic barrier layer and the organic barrier layer, thereby causing deterioration in reliability. If the adhesive strength is higher than 100 kgf/(mm)$^2$, uniformity of the organic barrier layer can be deteriorated. The inorganic barrier layer may include an inorganic barrier layer as described in detail below (for example, silicon oxide, silicon nitride, aluminum oxide, etc.), without being limited thereto. Preferably, the organic barrier layer may have an adhesive strength to the inorganic barrier layer of 12 kgf/(mm)$^2$ to 20 kgf/(mm)$^2$.

The organic barrier layer may be prepared by curing the photocurable composition as set forth above, and may employ any typical curing method.

One organic barrier layer may have a thickness of 0.1 μm to 20 μm, preferably 1 μm to 10 μm, without being limited thereto.

In addition, the organic barrier layer water has low water vapor permeability and thus can minimize effects of moisture on the member for the apparatus. The organic barrier layer has a water vapor permeability of 4.5 g/m$^2$·24 hr or less in the thickness direction of the organic barrier layer. Within this range, the organic barrier layer can be used for encapsulation of the member for the apparatus. The organic barrier layer preferably has a water vapor permeability of 1.0 g/m$^2$·24 hr to 4.5 g/m$^2$·24 hr, more preferably 2.1 g/m$^2$·24 hr to 4.1 g/m$^2$·24 hr.

Water vapor permeability may be measured by a typical method. For example, the photocurable composition is coated, followed by UV curing through UV irradiation at 100 mW/cm² for 10 seconds, thereby forming a cured specimen having a coating thickness of 5 μm. Water vapor permeability is measured on the 5 μm thick cured specimen at 37.8° C. and 100% RH for 24 hours.

Each of the inorganic and organic barrier layers may be composed of two or more layers in the apparatus. In one embodiment, the inorganic and organic barrier layers may be alternately deposited, for example, in order of inorganic barrier layer/organic barrier layer/inorganic barrier layer/organic barrier layer. Preferably, the inorganic and organic barrier layers are included in a total of 10 layers or less, more preferably in a total of 7 layers or less (for example, 2 layers to 7 layers).

FIG. 1 is a sectional view of an apparatus according to one embodiment of the present invention.

Referring to FIG. 1, the apparatus 100 includes a substrate 10, a member for the apparatus (for example, organic electroluminescent device) 20 formed on the substrate 10, and a complex barrier layer 30 including an inorganic barrier layer 31 and an organic barrier layer 32 and encapsulating the member for the apparatus, wherein the inorganic barrier layer 31 adjoins the member for the apparatus 20.

Figure 2:
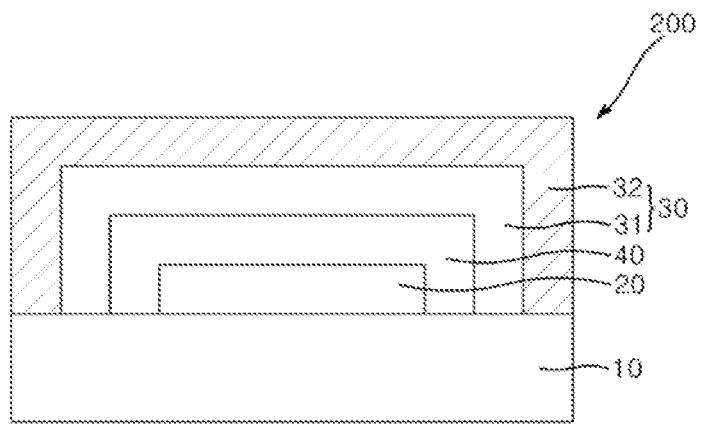
FIG. 2 is a schematic sectional view of an apparatus according to another embodiment of the present invention.

FIG. 2 is a sectional view of an apparatus according to another embodiment of the present invention.

Referring to FIG. 2, the apparatus 200 includes a substrate 10, a member for the apparatus 20 formed on the substrate 10, and a complex barrier layer 30 including an inorganic barrier layer 31 and an organic barrier layer 32 and encapsulating the member for the apparatus 20, wherein the inorganic barrier layer 31 may encapsulate an internal space containing the member for the apparatus 20.

Although each of the inorganic and organic barrier layers is illustrated as being formed as a single layer in FIGS. 1 and 2, each of the inorganic and organic barrier layers may be composed of multiple layers. In addition, the apparatus may further include a sealant and/or a substrate on a lateral side and/or an upper side of the complex barrier layer composed of the inorganic and organic barrier layers (not shown in FIGS. 1 and 2).

The apparatus may be prepared by any typical method. The member for the apparatus is formed on the substrate, followed by forming the inorganic barrier layer on the member for the apparatus. The photocurable composition is coated to a thickness of 0.1 μm to 20 μm by spin coating, slit coating, or the like, followed by irradiation to form the organic barrier layer. The procedure of forming the inorganic and organic barrier layers may be repeated (preferably 10 times or less, for example 2 times to 10 times).

Hereinafter, the present invention will be described in more detail with reference to some examples. However, it should be understood that these examples are provided for illustration only and are not to be in any way construed as limiting the present invention. A description of details apparent to those skilled in the art will be omitted for clarity.

Preparative Example 1: Preparation of Monomer 1 Containing Phosphorus and Amide Group (Formula 3)

In a 1000 ml flask provided with a cooling tube and a stirrer, 200 ml of 1,2-dichloroethane, 100 g of diethyl (hydroxymethyl)phosphonate (Daelim Chemicals), and 83 g of 2-isocyanatoethyl acrylate (Showa Denko Co., Ltd.) were placed, followed by stirring at 40° C. for 6 hours while refluxing with nitrogen. After completion of reaction, 1,2-dichloroethane was removed by vacuum distillation, followed by silica gel column chromatography, thereby obtaining 160 g of a compound represented by Formula 3. The obtained compound had an HPLC purity of 98%.

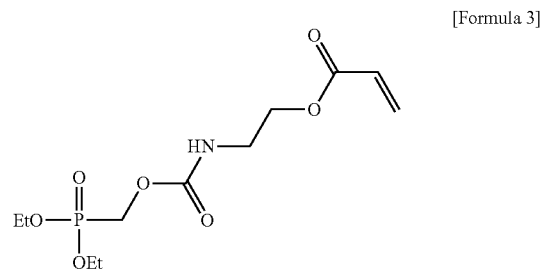 [SMILES: C=CC(=O)OCCNC(=O)OCP(=O)(OCC)OCC]

[Formula 3]

Preparative Example 2: Preparation of Monomer 2 Containing Phosphorus and Amide Group (Formula 4)

In a 1000 ml flask provided with a cooling tube and a stirrer, 200 ml of 1,2-dichloroethane, 100 g of (diphenylphosphoryl)methanol (Cambridge Chemical Corporation), and 60 g of 2-isocyanatoethyl acrylate (Showa Denko Co., Ltd.) were placed, followed by stirring at 40° C. for 6 hours while refluxing with nitrogen. After completion of reaction, 1,2-dichloroethane was removed by vacuum distillation, followed by silica gel column chromatography, thereby obtaining 150 g of a compound represented by Formula 4. The obtained compound had an HPLC purity of 98%.

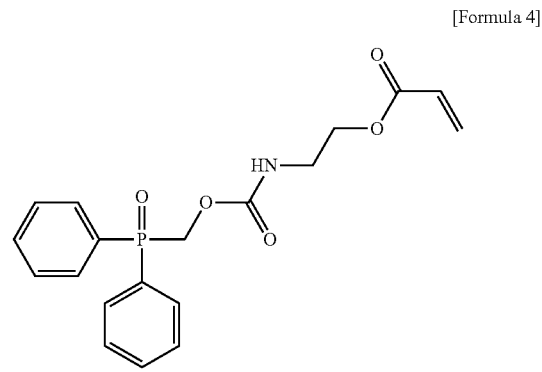 [SMILES: C=CC(=O)OCCNC(=O)OCP(=O)(c1ccccc1)c1ccccc1]

[Formula 4]

Preparative Example 3: Preparation of Monomer Containing Phosphorus (Formula 5)

In a 1000 ml flask provided with a cooling tube and a stirrer, 200 ml of 1,2-dichloroethane, 50 g of (chloromethyl) diphenylphosphine oxide (Akos Co., Ltd.), and 30.5 g of 4-hydroxybutyl acrylate (Osaka Yuki Chemical) were placed, followed by cooling to 5° C., and then 21.4 g of trimethylamine was added for 1 hour, followed by heating to 50° C. and stirring for 6 hours. After completion of reaction, 1,2-dichloroethane was removed by vacuum distillation, followed by silica gel column chromatography, thereby obtaining 160 g of a compound represented by Formula 5. The obtained compound had a purity of 98% as determined by HPLC.

[Formula 5]

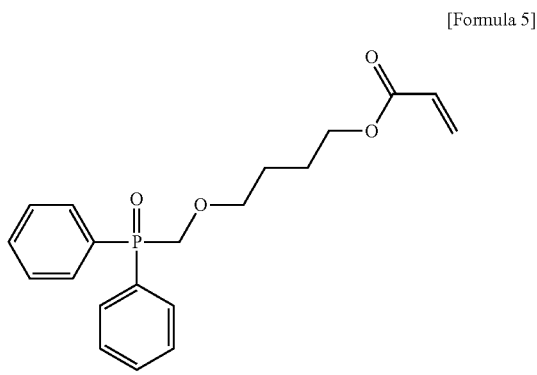 [SMILES: C=CC(=O)OCCCCOCP(=O)(c1ccccc1)c1ccccc1]

Details of components used in Examples and Comparative Examples are as follows:

(A) Photocurable monomer: (A1) Hexyl acrylate, (A2) Hexanediol diacrylate, (A3) Pentaerythritol tetraacrylate (Aldrich Chemical)

(B) Monomer containing phosphorus and amide group: (B1) Monomer in Preparative Example 1, (B2) Monomer in Preparative Example 2

(C) Initiator: Darocur TPO (BASF Co., Ltd.)

(D) Monomer containing phosphorus: Monomer in Preparative Example 3

Examples and Comparative Examples

In a 125 ml brown polypropylene bottle, (A) the photocurable monomer, (B) the monomer containing phosphorus and an amide group, and (C) the initiator were placed in amounts as listed in Table 2 (unit: wt %), followed by mixing for 3 hours using a shaker, thereby preparing compositions of Examples and Comparative Examples.

Each of the compositions prepared in Examples and Comparative Examples was evaluated as to the following properties. Results are shown in Table 2.

Evaluation of Properties

1. Water Vapor Permeability:

A water vapor permeability tester (PERMATRAN-W 3/33, MOCON Co., Ltd.) was used. The photocurable composition was spray-coated onto an Al sample holder, followed by UV curing through UV irradiation at 100 mW/cm$^2$ for 10 seconds, thereby forming a cured specimen having a coating thickness of 5 μm. Water vapor permeability was measured on the 5 μm thick cured specimen at 37.8° C. and 100% RH for 24 hours using a water vapor permeability tester (PERMATRAN-W 3/33, MOCON Co., Ltd.).

2. Outgassing Amount:

The photocurable composition was spray-coated onto a glass substrate, followed by UV curing through UV irradiation at 100 mW/cm$^2$ for 10 seconds, thereby obtaining an organic barrier layer specimen having a size of 20 cm×20 cm×3 μm (width×length×thickness). Outgassing amount was measured on the specimen using a GC/MS tester (Perkin Elmer Clarus 600). GC/MS utilized a DB-5MS column (length: 30 m, diameter: 0.25 mm, thickness of stationary phase: 0.25 μm) as a column, and helium gas (flow rate: 1.0 mL/min, average velocity=32 cm/s) as a mobile phase. Further, the split ratio was 20:1, and the specimen was maintained at 40° C. for 3 minutes, heated at a rate of 10° C./min and then maintained at 320° C. for 6 minutes. Outgas was collected under the conditions that a glass size was 20 cm×20 cm, a collection container was a Tedlar bag, collection temperature was 90° C., collection time was 30 minutes, N$_2$ purging was performed at a flow rate of 300 mL/min, and Tenax GR (5% phenyl methyl polysiloxane) was used as an adsorbent. A calibration curve was plotted using a toluene solution in n-hexane in a concentration of 150 ppm, 400 ppm and 800 ppm as a standard solution, wherein R2 value was 0.9987. The above conditions are summarized in Table 1.

TABLE 1

| Conditions | | Details |
|---|---|---|
| Collection conditions | | Glass size: 20 cm × 20 cm |
| | | Collection container: Tedlar bag |
| | | Collection temperature: 90° C. |
| | | Collection time: 30 min |
| | | N2 purge flow rate: 300 mL/min |
| | | Adsorbent: Tenax GR (5% phenyl methyl polysiloxane) |
| Conditions for plotting calibration curve | | Standard solution: Toluene in n-hexane Concentration range (reference): 150 ppm, 400 ppm, 800 ppm R2: 0.9987 |
| GC/MS conditions | Column | DB-5MS→30 m × 0.25 mm × 0.25 μm (5% phenyl methyl polysiloxane) |
| | Mobile phase | He |
| | Flow | 1.0 mL/min (Average velocity = 32 cm/s) |
| | Split | Split ratio = 20:1 |
| | Method | 40° C. (3 min) → 10° C./min → 320° C. (6 min) |

3. Photocuring Rate:

The photocurable composition was measured as to intensity of absorption peaks in the vicinity of 1635 cm$^{-1}$ (C═C) and 1720 cm$^{-1}$ (C═O) using an FT-IR (NICOLET 4700, Thermo Co., Ltd.). The photocurable composition was spray-coated onto a glass substrate, followed by UV curing through UV irradiation at 100 mW/cm$^2$ for 10 seconds, thereby obtaining a specimen having a size of 20 cm×20 cm×3 μm (width×length×thickness). Then, the cured film was aliquoted, and the intensity of absorption peaks of the cured film was measured in the vicinity of 1635 cm$^{-1}$ (C═C) and 1720 cm$^{-1}$ (C═O) using an FT-IR spectrometer (NICOLET 4700, Thermo Co., Ltd.). Photocuring rate was calculated by Equation 1:

[Equation 1]

$$\text{Photocuring rate (\%)} = |1-(A/B)| \times 100 \quad (1)$$

(wherein A is a ratio of the intensity of an absorption peak in the vicinity of 1635 cm$^{-1}$ to the intensity of an absorption peak in the vicinity of 1720 cm$^{-1}$ measured for the cured film, and B is a ratio of the intensity of an absorption peak in the vicinity of 1635 cm$^{-1}$ to the intensity of an absorption peak in the vicinity of 1720 cm$^{-1}$ measured for the photocurable composition).

4. Adhesive Strength:

To measure adhesive strength, 0.01 g of the photocurable composition was coated onto a glass substrate having a size of 5 mm×5 mm×2 mm (width×length×height). A glass substrate having a size of 20 mm×80 mm×2 mm (width×length×height) was stacked on the photocurable composition coating layer, followed by curing by exposure to light at a radiant exposure of 1000 J/cm$^2$ using a D-bulb light source. For the cured product, die shear strength was measured using a Dage 4000 bond tester.

TABLE 2

|   |    | Example 1 | 2 | 3 | 4 | 5 | 6 | 7 | Comparative Example 1 | 2 | 3 | 4 |
|---|----|---|---|---|---|---|---|---|---|---|---|---|
| A | A1 | — | — | — | — | — | — | 10 | 10 | 20 | 30 | — |
|   | A2 | 60 | 60 | 60 | 60 | 60 | 60 | 60 | 60 | 60 | 60 | 60 |
|   | A3 | 30 | 20 | 10 | 30 | 20 | 10 | 20 | 30 | 20 | 10 | 30 |
| B | B1 | 10 | 20 | 30 | — | — | — | 10 | — | — | — | — |
|   | B2 | — | — | — | 10 | 20 | 30 | — | — | — | — | — |
| C |    | 5 | 5 | 5 | 5 | 5 | 5 | 5 | 5 | 5 | 5 | 5 |
| D |    | — | — | — | — | — | — | — | — | — | — | 10 |
| Water vapor permeability (g/m² · 4 hr) | | 2.1 | 2.3 | 3.2 | 4.1 | 2.6 | 2.8 | 3.3 | 6.9 | 7.5 | 9.9 | 12.0 |
| Outgassing amount (ppm) | | 210 | 280 | 430 | 740 | 190 | 180 | 550 | 1290 | 1540 | 2980 | 1830 |
| Photocuring rate (%) | | 94.3 | 95.6 | 96 | 93 | 96.3 | 96.6 | 95 | 82 | 88 | 89 | 88 |
| Adhesive strength (kgf/(mm)²) | | 15.4 | 16.9 | 17.1 | 13.6 | 14.3 | 15.2 | 12.5 | 5.8 | 6.3 | 6.1 | 10.0 |

As shown in Table 2, it could be seen that the coating layers formed of the photocurable compositions according to the present invention had low water vapor permeability; exhibited considerably low outgassing, as compared with Comparative Examples in evaluation of outgassing; and had high adhesive strength and photocuring rate. Conversely, it could be seen that the coating layers formed of the compositions in Comparative Examples 1 to 3 not including the monomer (B) of the present invention had relatively high water vapor permeability and outgassing and exhibited relatively low adhesive strength and photocuring rate as compared with those of Examples, and thus could not provide effects comparable to those of the present invention. In addition, it could be seen that, although the coating layer formed of the composition containing only phosphorus in Comparative Example 4 had an adhesive strength equal to those of Examples, the coating layer exhibited considerably higher water vapor permeability and lower photocuring rate than those of Examples.

Although some embodiments have been described herein, it should be understood by those skilled in the art that these embodiments are given by way of illustration only and the present invention is not limited thereto. In addition, it should be understood that various modifications, variations, and alterations can be made by those skilled in the art without departing from the spirit and scope of the present invention. Therefore, the scope of the invention should be limited only by the accompanying claims and equivalents thereof.

The invention claimed is:

1. A photocurable composition comprising:

(A) a photocurable monomer; and (B) a monomer represented by Formula 1, wherein the photocurable monomer (A) includes one or more of a $C_1$ to $C_{20}$ alkyl group-containing (meth)acrylate, a $C_2$ to $C_{20}$ diol di(meth)acrylate, a $C_3$ to $C_{20}$ triol tri(meth)acrylate, or a $C_4$ to $C_{20}$ tetraol tetra(meth)acrylate, wherein the photocurable composition includes, in terms of solid content, 60 parts by weight to 95 parts by weight of the photocurable monomer (A) and 5 parts by weight to 40 parts by weight of the monomer (B) based on 100 parts by weight of (A)+(B),

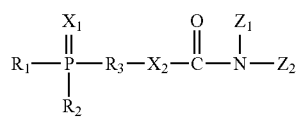

[Formula 1]

wherein, in Formula 1, $X_1$ and $X_2$ are each independently O, S, NH, or NR', in which R' is a hydrogen or a substituted or unsubstituted $C_1$ to $C_{20}$ alkyl group;

$R_1$ and $R_2$ are each independently a substituted or unsubstituted $C_6$ to $C_{30}$ aryl group or a substituted or unsubstituted $C_7$ to $C_{30}$ arylalkyl group, $R_3$ is a substituted or unsubstituted $C_1$ to $C_{30}$ alkylene group, a substituted or unsubstituted $C_5$ to $C_{30}$ cycloalkylene group, a substituted or unsubstituted $C_1$ to $C_{30}$ alkyl ether group, a substituted or unsubstituted $C_1$ to $C_{30}$ alkylamine group, a substituted or unsubstituted $C_6$ to $C_{30}$ arylene group, a substituted or unsubstituted $C_7$ to $C_{30}$ arylalkylene group, or a substituted or unsubstituted $C_1$ to $C_{30}$ alkyleneoxy group;

$Z_1$ is hydrogen, $Z_2$ is a group represented by Formula 2:

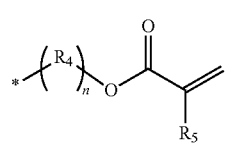

[Formula 2]

wherein, in Formula 2, * represents a binding site to N in Formula 1; $R_4$ is a substituted or unsubstituted $C_1$ to $C_{30}$ alkylene group, a substituted or unsubstituted $C_6$ to $C_{30}$ arylene group, a substituted or unsubstituted $C_7$ to $C_{30}$ arylalkylene group, or a substituted or unsubstituted $C_1$ to $C_{30}$ alkyleneoxy group; $R_5$ is hydrogen or a substituted or unsubstituted $C_1$ to $C_5$ alkyl group; and n is an integer from 0 to 20.

2. The photocurable composition according to claim 1, wherein the monomer (B) includes a compound represented by Formula 4:

[Formula 4]

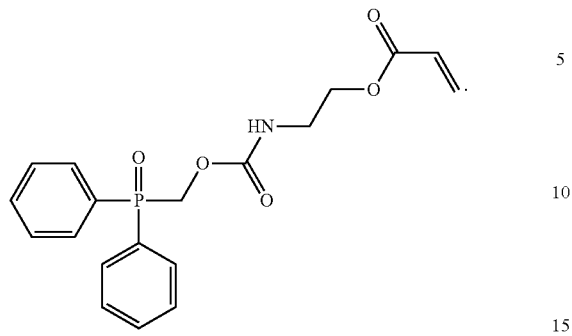

3. The photocurable composition according to claim 1, further comprising: (C) an initiator.

4. The photocurable composition according to claim 3, wherein the initiator (C) includes a photopolymerization initiator.

5. The photocurable composition according to claim 3, wherein the photocurable composition comprises, in terms of solid content, 0.1 parts by weight to 20 parts by weight of the initiator (C) based on 100 parts by weight of (A)+(B).

6. The photocurable composition according to claim 1, wherein:
   the photocurable monomer (A) includes a $C_2$ to $C_{20}$ diol di(meth)acrylate and a $C_4$ to $C_{20}$ tetraol tetra(meth)acrylate, and
   a weight ratio of the $C_4$ to $C_{20}$ tetraol tetra(meth)acrylate to the $C_2$ to $C_{20}$ diol di(meth)acrylate is 1:6 to 3:6.

* * * * *